United States Patent
Li et al.

(10) Patent No.: US 11,101,387 B2
(45) Date of Patent: Aug. 24, 2021

(54) LOW TEMPERATURE POLYSILICON LAYER, THIN FILM TRANSISTOR, AND METHOD FOR MANUFACTURING SAME

(71) Applicant: WUHAN CHINA STAR OPTOELECTRONICS TECHNOLOGY CO., LTD., Wuhan (CN)

(72) Inventors: Lisheng Li, Wuhan (CN); Peng He, Wuhan (CN); Yuan Yan, Wuhan (CN)

( * ) Notice: Subject to any disclaimer, the term of this patent is extended or adjusted under 35 U.S.C. 154(b) by 307 days.

(21) Appl. No.: 16/344,018

(22) PCT Filed: Nov. 19, 2018

(86) PCT No.: PCT/CN2018/116173
§ 371 (c)(1),
(2) Date: Apr. 23, 2019

(87) PCT Pub. No.: WO2020/062497
PCT Pub. Date: Apr. 2, 2020

(65) Prior Publication Data
US 2021/0184050 A1    Jun. 17, 2021

(30) Foreign Application Priority Data
Sep. 27, 2018 (CN) .......................... 201811134009.6

(51) Int. Cl.
*H01L 29/78*      (2006.01)
*H01L 29/786*    (2006.01)
*H01L 21/02*      (2006.01)
*H01L 29/10*      (2006.01)
*H01L 29/66*      (2006.01)

(52) U.S. Cl.
CPC .. *H01L 29/78696* (2013.01); *H01L 21/02532* (2013.01); *H01L 21/02595* (2013.01); *H01L 29/1033* (2013.01); *H01L 29/6675* (2013.01); *H01L 29/78672* (2013.01)

(58) Field of Classification Search
CPC ......... H01L 29/78696; H01L 21/02532; H01L 21/02595; H01L 29/1033; H01L 29/6675; H01L 29/78672; H01L 29/66757; H01L 29/786
USPC .......................................... 257/288; 438/197
See application file for complete search history.

(56) References Cited

U.S. PATENT DOCUMENTS

| | | | |
|---|---|---|---|
| 2006/0091394 A1* | 5/2006 | Honda | H01L 29/78678 257/66 |
| 2008/0017865 A1* | 1/2008 | Itoh | H01L 29/78696 257/72 |
| 2008/0203477 A1* | 8/2008 | Yamazaki | H01L 27/1214 257/347 |

(Continued)

*Primary Examiner* — Sheikh Maruf

(57) ABSTRACT

A low temperature polysilicon layer, a thin film transistor, and a method for manufacturing same are provided. The low temperature polysilicon layer includes a substrate, at least one buffer layer, and a polysilicon layer. The polysilicon layer is disposed on the at least one buffer layer. The polysilicon layer includes a channel region, two low doped regions disposed on two sides of the channel region, and two high doped regions disposed on an outer side of the low doped regions. Thicknesses of an edge of the channel region and at least one portion of the low doped regions are less than a thickness of another position of the polysilicon layer.

14 Claims, 6 Drawing Sheets

(56) References Cited

U.S. PATENT DOCUMENTS

| | | | |
|---|---|---|---|
| 2008/0308807 A1* | 12/2008 | Yamazaki | H01L 27/1288 257/59 |
| 2009/0008645 A1* | 1/2009 | Yamazaki | H01L 27/1214 257/59 |
| 2009/0009677 A1* | 1/2009 | Yamazaki | G02F 1/1339 349/43 |
| 2009/0039351 A1* | 2/2009 | Kobayashi | H01L 29/41733 257/59 |
| 2016/0027855 A1* | 1/2016 | Kim | H01L 27/127 257/72 |
| 2017/0018652 A1* | 1/2017 | Liu | H01L 27/1288 |
| 2018/0033883 A1* | 2/2018 | Zhou | H01L 29/786 |
| 2018/0151597 A1* | 5/2018 | Yamazaki | G06F 3/0412 |
| 2018/0351000 A1* | 12/2018 | Wang | H01L 21/02532 |
| 2019/0027587 A1* | 1/2019 | Li | H01L 21/268 |

* cited by examiner

LOW TEMPERATURE POLYSILICON LAYER, THIN FILM TRANSISTOR, AND METHOD FOR MANUFACTURING SAME

FIELD OF INVENTION

The present disclosure relates to the field of display technologies, and more particularly to a low temperature polysilicon layer, a thin film transistor, and a method for manufacturing same.

BACKGROUND OF INVENTION

Low temperature polysilicon (LTPS) technologies have high carrier mobility and are widely used in fabrications of thin film transistor-liquid crystal displays (TFT LCDs) having high resolution and active-matrix organic light emitting diode (AMOLED) panels. Therefore, the LTPS technologies have broad application.

In current low temperature polysilicon technologies, a thin film transistor generally includes a top gate structure and a light shielding (LS) layer. A fabrication of the light shielding layer requires adding a light shielding layer mask process, and therefore, a number of masks required for a thin film transistor array substrate fabrication is greater and a production cycle thereof is longer.

In another current low temperature polysilicon technology, a channel of a thin film transistor is prone to cause photo-induced leakage current, and excessive leakage current significantly affects an optical display performance of a display device, such as crosstalk, flicker, and contrast reduction.

Therefore, there is a need to provide a low temperature polysilicon layer, a thin film transistor, and a method for manufacturing same to solve issues of the prior art.

SUMMARY OF INVENTION

In order to solve the above technical problems, an embodiment of the present disclosure provides a method for manufacturing a low temperature polysilicon layer. The method for manufacturing the low temperature polysilicon layer includes:
providing a substrate;
forming at least one buffer layer on the substrate;
forming a polysilicon layer on the at least one buffer layer;
patterning the polysilicon layer to form a channel region, wherein two sides of the channel region include two low doped regions symmetrically disposed, and an outer side of the low doped regions include two high doped regions symmetrically disposed;
depositing an island-shaped photoresist layer on the channel region, the low doped regions, and the high doped regions of the polysilicon layer; removing an edge of the channel region and the island-shaped photoresist layer in the low doped regions to expose an edge of the channel region and the low doped regions;
etching the edge of the channel region and at least one portion of the low doped regions such that thicknesses of the edge of the channel region and the at least one portion of the low doped regions are less than a thickness of another position of the polysilicon layer to form an island-shaped polysilicon layer; and
stripping the island-shaped photoresist layer;
wherein the low doped regions are n-type low doped regions, and the high doped regions are n-type high doped regions;
wherein the island-shaped photoresist layer has a first thickness and a second thickness, the first thickness is less than the second thickness, and the island-shaped photoresist layer having the first thickness covers the edge of the channel region and the low doped regions;
wherein the island-shaped photoresist layer is exposed and developed by a halftone mask to form the island-shaped photoresist layer, the halftone mask has an opaque region and a light transmissive region, the light transmissive region of the halftone mask corresponds to the edge of the channel region and the low doped regions, and the opaque region of the halftone mask corresponds to the another position of the polysilicon layer.

In an embodiment of the present disclosure, the channel region of the polysilicon layer has different thicknesses, the thicknesses of the edge of the channel region of the polysilicon layer and the at least one portion of the low doped regions are less than a thickness of another position of the channel region of the polysilicon layer.

In an embodiment of the present disclosure, the high doped regions of the polysilicon layer have different thicknesses, and an edge of the high doped regions of the polysilicon layer contacts the low doped regions, a thickness of the edge of the high doped regions is equal to the thicknesses of the edge of the channel region of the polysilicon layer and the at least one portion of the low doped regions, and a thickness of another position of the high doped regions is equal to a thickness of another position of the channel region of the polysilicon layer.

An embodiment of the present disclosure further provides a method for manufacturing a low temperature polysilicon layer. The method for manufacturing the low temperature polysilicon layer includes:
providing a substrate;
forming at least one buffer layer on the substrate;
forming a polysilicon layer on the at least one buffer layer;
patterning the polysilicon layer to form a channel region, wherein two sides of the channel region include two low doped regions symmetrically disposed, and an outer side of the low doped regions include two high doped regions symmetrically disposed;
depositing an island-shaped photoresist layer on the channel region, the low doped regions, and the high doped regions of the polysilicon layer;
removing an edge of the channel region and the island-shaped photoresist layer in the low doped regions to expose an edge of the channel region and the low doped regions;
etching the edge of the channel region and at least one portion of the low doped regions such that thicknesses of the edge of the channel region and the at least one portion of the low doped regions are less than a thickness of another position of the polysilicon layer to form an island-shaped polysilicon layer; and stripping the island-shaped photoresist layer.

In an embodiment of the present disclosure, the method further includes forming an amorphous silicon layer on the at least one buffer layer, performing an excimer laser operation to the amorphous silicon layer to cause the amorphous silicon layer to become the polysilicon layer, and removing the polysilicon layer not covered by the island-shaped photoresist layer by etching.

In an embodiment of the present disclosure, the low doped regions are n-type low doped regions, and the high doped regions are n-type high doped regions.

In an embodiment of the present disclosure, the island-shaped photoresist layer has a first thickness and a second thickness, the first thickness is less than the second thickness, and the island-shaped photoresist layer having the first thickness covers the edge of the channel region and the low doped regions.

In an embodiment of the present disclosure, the island-shaped photoresist layer is exposed and developed by a halftone mask to form the island-shaped photoresist layer, the halftone mask has an opaque region and a light transmissive region, the light transmissive region of the halftone mask corresponds to the edge of the channel region and the low doped regions, and the opaque region of the halftone mask corresponds to the another position of the polysilicon layer.

In an embodiment of the present disclosure, the method further includes performing a photoresist ashing process to the island-shaped photoresist layer covering the edge of the channel region and the low doped regions by introducing oxygen to remove the island-shaped photoresist layer covering the edge of the channel region and the low doped regions.

In an embodiment of the present disclosure, the channel region of the polysilicon layer has different thicknesses, the thicknesses of the edge of the channel region of the polysilicon layer and the at least one portion of the low doped regions are less than a thickness of another position of the channel region of the polysilicon layer.

In an embodiment of the present disclosure, the high doped regions of the polysilicon layer have different thicknesses, and an edge of the high doped regions of the polysilicon layer contacts the low doped regions, a thickness of the edge of the high doped regions is equal to the thicknesses of the edge of the channel region of the polysilicon layer and the at least one portion of the low doped regions, and a thickness of another position of the high doped regions is equal to a thickness of another position of the channel region of the polysilicon layer.

An embodiment of the present disclosure further provides a method for manufacturing a thin film transistor. The method for manufacturing the thin film transistor includes:
providing a low temperature polysilicon layer; and
forming a gate insulating layer, a gate electrode, an interlayer dielectric insulating layer, two via holes, a source electrode, and a drain electrode on the low temperature polysilicon layer;
wherein the via holes go through the gate insulating layer and the interlayer dielectric insulating layer, the source electrode and the drain electrode are in contact with two ends of the low temperature polysilicon layer through corresponding via holes, and the low temperature polysilicon layer is formed by a method for manufacturing the low temperature polysilicon layer;
wherein the method for manufacturing the low temperature polysilicon layer includes:
providing a substrate;
forming at least one buffer layer on the substrate;
forming a polysilicon layer on the at least one buffer layer;
patterning the polysilicon layer to form a channel region, wherein two sides of the channel region include two low doped regions symmetrically disposed, and an outer side of the low doped regions include two high doped regions symmetrically disposed;
depositing an island-shaped photoresist layer on the channel region, the low doped regions, and the high doped regions of the polysilicon layer;
removing an edge of the channel region and the island-shaped photoresist layer in the low doped regions to expose an edge of the channel region and the low doped regions;
etching the edge of the channel region and at least one portion of the low doped regions such that thicknesses of the edge of the channel region and the at least one portion of the low doped regions are less than a thickness of another position of the polysilicon layer to form an island-shaped polysilicon layer; and
stripping the island-shaped photoresist layer.

In an embodiment of the present disclosure, a distance between the gate electrode and the edge of the channel region of the polysilicon layer is less than a distance between the gate electrode and another position of the channel region of the polysilicon layer.

In an embodiment of the present disclosure, a distance between the gate electrode and at least one portion of the low doped regions of the polysilicon layer is less than a distance between the gate electrode and another position of the channel region of the polysilicon layer.

An embodiment of the present disclosure further provides a low temperature polysilicon layer. The low temperature polysilicon layer includes a substrate, at least one buffer layer disposed on the substrate, and a polysilicon layer disposed on the at least one buffer layer. The polysilicon layer includes a channel region, two low doped regions disposed on two sides of the channel region, and two high doped regions disposed on an outer side of the low doped regions. Thicknesses of an edge of the channel region and at least one portion of the low doped regions are less than a thickness of another position of the polysilicon layer.

In an embodiment of the present disclosure, the channel region of the polysilicon layer has different thicknesses, the thicknesses of the edge of the channel region of the polysilicon layer and the at least one portion of the low doped regions are less than a thickness of another position of the channel region of the polysilicon layer.

In an embodiment of the present disclosure, the high doped regions of the polysilicon layer have different thicknesses, and an edge of the high doped regions of the polysilicon layer contacts the low doped regions, a thickness of the edge of the high doped regions is equal to the thicknesses of the edge of the channel region of the polysilicon layer and the at least one portion of the low doped regions, and a thickness of another position of the high doped regions is equal to a thickness of another position of the channel region of the polysilicon layer.

An embodiment of the present disclosure further provides a thin film transistor. The thin film transistor includes a low temperature polysilicon layer, a gate insulating layer, a gate electrode, an interlayer dielectric insulating layer, two via holes, a source electrode, and a drain electrode disposed on the low temperature polysilicon layer. The via holes go through the gate insulating layer and the interlayer dielectric insulating layer, and the source electrode and the drain electrode are in contact with two ends of the low temperature polysilicon layer through corresponding via holes. The low temperature polysilicon layer includes a substrate, at least one buffer layer disposed on the substrate, and a polysilicon layer disposed on the at least one buffer layer. The polysilicon layer includes a channel region, two low doped regions disposed on two sides of the channel region, and two high doped regions disposed on an outer side of the low doped regions. Thicknesses of an edge of the channel region and at least one portion of the low doped regions are less than a thickness of another position of the polysilicon layer.

In an embodiment of the present disclosure, a distance between the gate electrode and the edge of the channel region of the polysilicon layer is less than a distance between the gate electrode and another position of the channel region of the polysilicon layer.

In an embodiment of the present disclosure, a distance between the gate electrode and at least one portion of the low doped regions of the polysilicon layer is less than a distance between the gate electrode and another position of the channel region of the polysilicon layer.

Compared with the prior art, in order to solve the above technical problems, the embodiment of the present disclosure provides a low temperature polysilicon layer, a thin film transistor, and a method for manufacturing same. Thicknesses of an edge of the channel region and at least one portion of the low doped regions are less than a thickness of another position of the polysilicon layer, which can reduce an absorption of photons by the low temperature polysilicon layer and reduce photo-induced leakage current of the low temperature polysilicon layer.

DETAILED DESCRIPTION OF PREFERRED EMBODIMENTS

Figure 1:
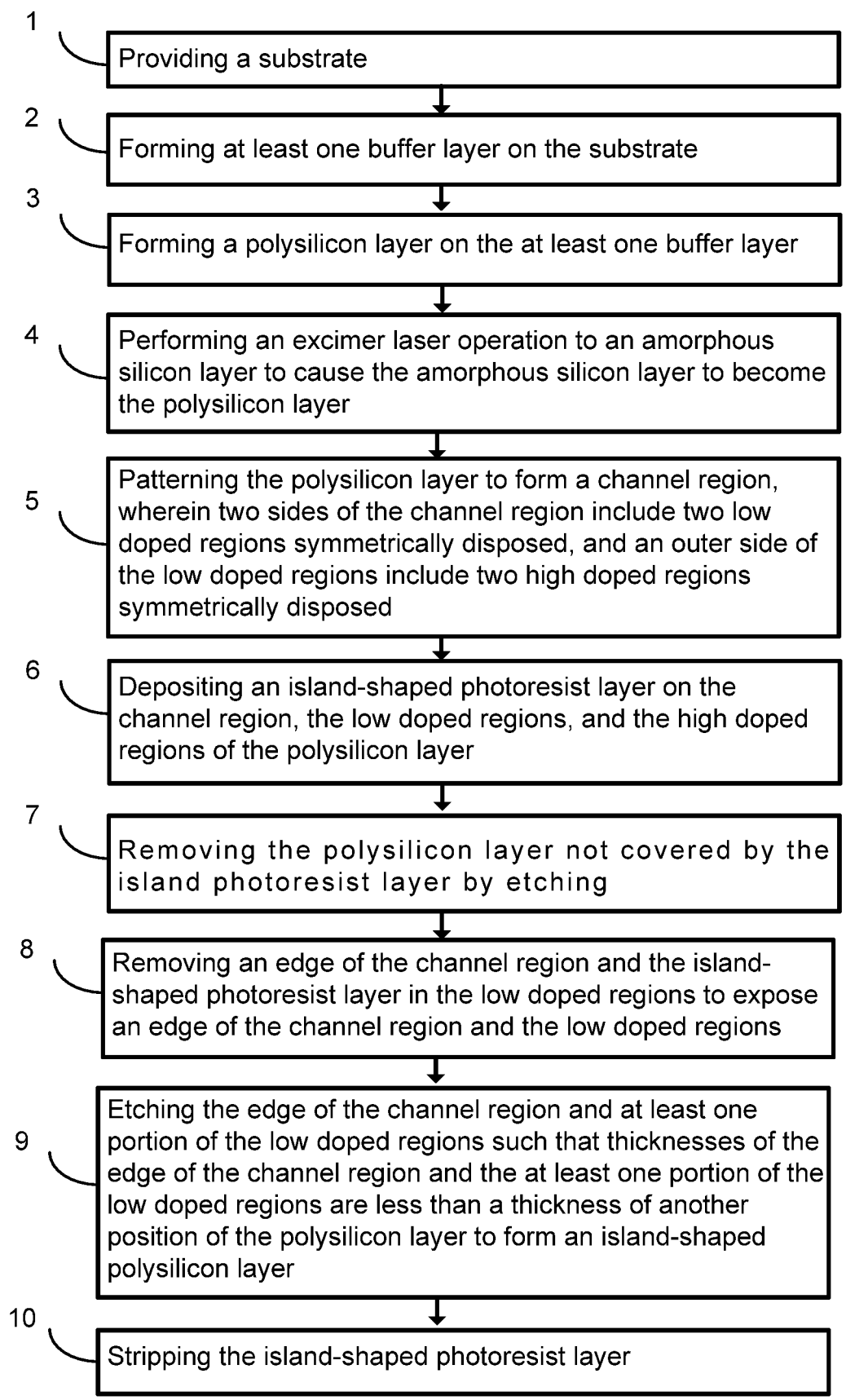
FIG. 1 is a flowchart of a method for manufacturing a low temperature polysilicon layer according to an embodiment of the present disclosure.

The following description of the various embodiments is provided to illustrate the specific embodiments with reference to the accompanying drawings.

In order to make the above description of the present disclosure and other objects, features, and advantages of the present disclosure more comprehensible, preferred embodiments are described below, and are described in detail below with reference to the accompanying drawings. Furthermore, directional terms described by the present disclosure, such as up, down, top, bottom, front, back, left, right, inner, outer, side, surrounding, center, horizontal, vertical, longitudinal, axial, radial, uppermost or lowermost, etc., are only directions by referring to the accompanying drawings, and thus the used terms are used only for the purpose of describing embodiments of the present disclosure and are not intended to be limiting of the present disclosure.

In the drawings, units with similar structures are labeled with the same reference number.

Referring to FIG. 1, an embodiment of the present disclosure provides a method for manufacturing a low temperature polysilicon layer including following steps.

Figure 2:
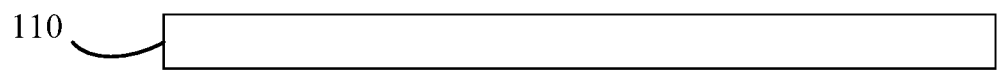
FIG. 2 is a schematic diagram of a method for manufacturing a low temperature polysilicon layer according to an embodiment of the present disclosure.

Referring to FIGS. 1 and 2, in a step 1, a substrate 110 is provided.

In details, the substrate 110 is, for example, a glass substrate.

Figure 3:
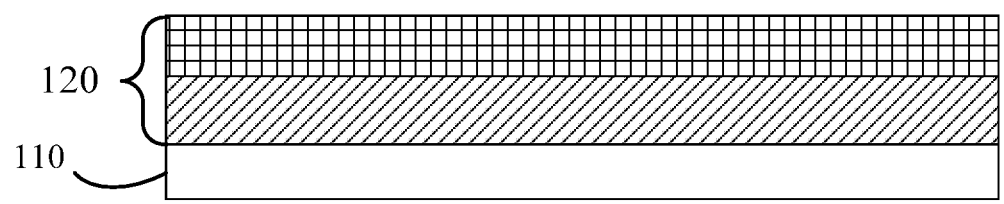
FIG. 3 is a schematic diagram of a method for manufacturing a low temperature polysilicon layer according to an embodiment of the present disclosure.

Referring to FIGS. 1 and 3, in a step 2, at least one buffer layer 120 is formed on the substrate 110.

In details, material of the at least one buffer layer 120 is silicon nitride (SiNx), silicon oxide (SiOx), or a combination of SiNx and SiOx. The at least one buffer layer 120 may be a structure of two buffer layers. Material of the two buffer layers can be different. Because the at least one buffer layer 120 is disposed on the substrate 110, an ion diffusion and heat preservation is blocked, and the substrate 110 is prevented from being damaged.

Figure 4:
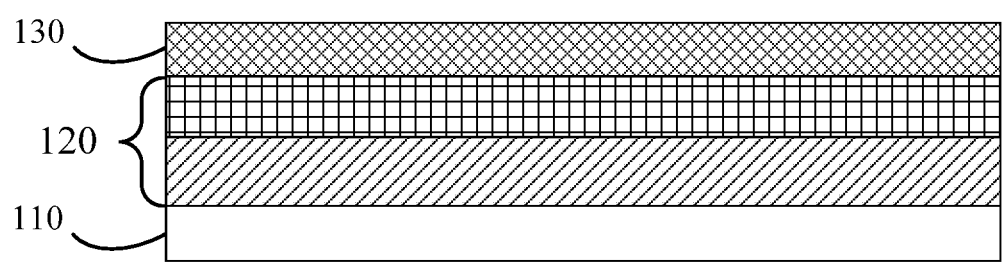
FIG. 4 is a schematic diagram of a method for manufacturing a low temperature polysilicon layer according to an embodiment of the present disclosure.

Referring to FIGS. 1 and 4, in a step 3, an amorphous silicon layer 130 is formed on the at least one buffer layer 120.

Figure 5:
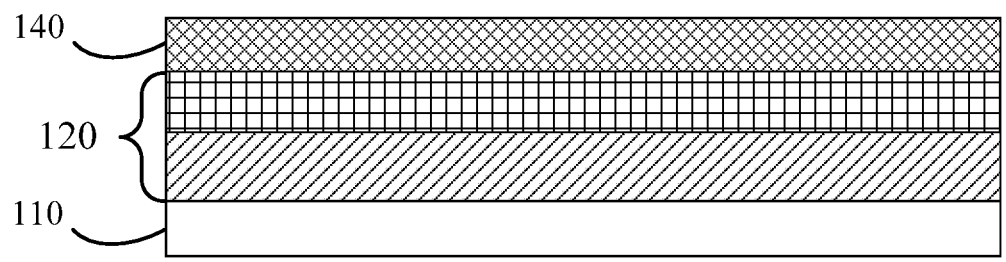
FIG. 5 is a schematic diagram of a method for manufacturing a low temperature polysilicon layer according to an embodiment of the present disclosure.

Referring to FIGS. 1 and 5, in a step 4, an excimer laser operation is performed to the amorphous silicon layer 130 to cause the amorphous silicon layer 130 to become a polysilicon layer 140.

Figure 6:
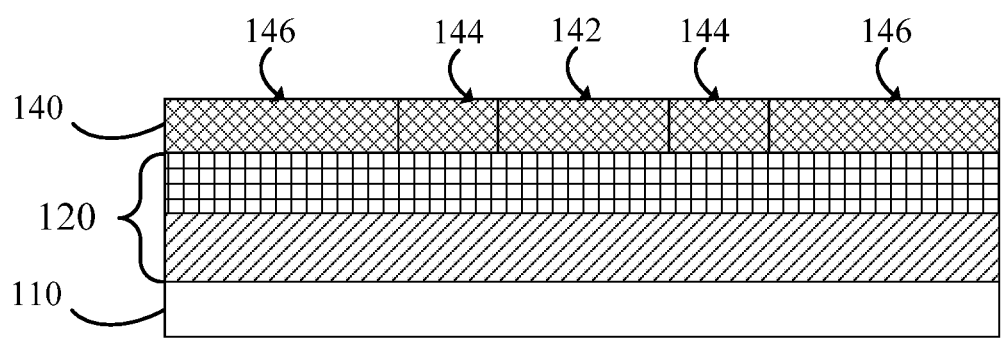
FIG. 6 is a schematic diagram of a method for manufacturing a low temperature polysilicon layer according to an embodiment of the present disclosure.

Referring to FIGS. 1 and 6, in a step 5, patterning the polysilicon layer 140 to form a channel region 142 is provided. Two sides of the channel region 142 include two low doped regions 144 that are symmetrically disposed, and an outer side of the low doped regions 144 include two high doped regions 146 that are symmetrically disposed.

In details, the low doped regions 144 are n-type low doped regions, and the high doped regions 146 are n-type high doped regions.

Figure 7:
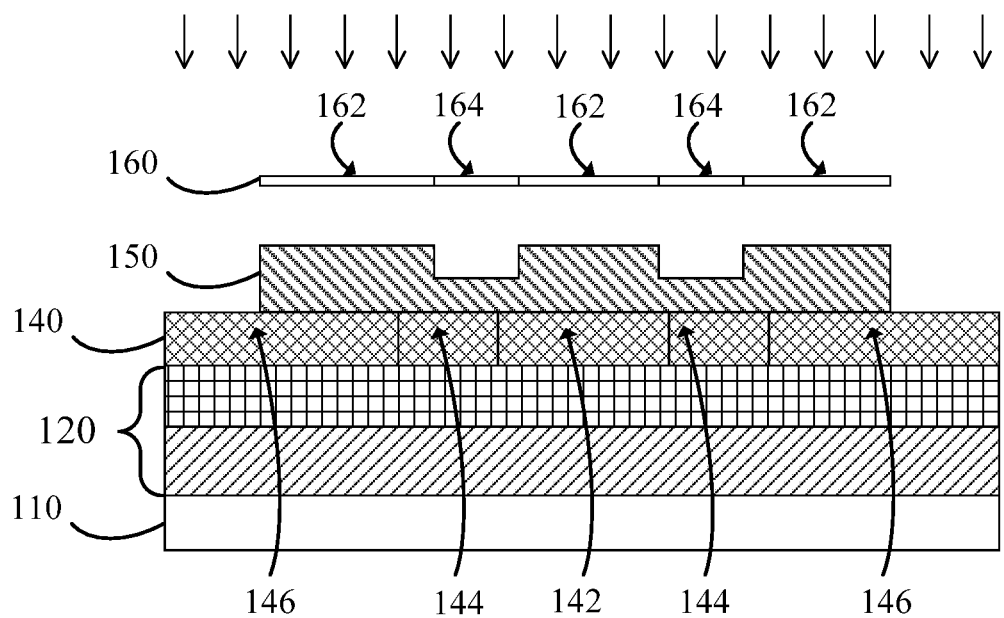
FIG. 7 is a schematic diagram of a method for manufacturing a low temperature polysilicon layer according to an embodiment of the present disclosure.

Referring to FIGS. 1 and 7, in a step 6, an island-shaped photoresist layer 150 is deposited on the channel region 142, the low doped regions 144, and the high doped regions 146 of the polysilicon layer 140.

In details, the island-shaped photoresist layer 150 has a first thickness and a second thickness. The first thickness is less than the second thickness, and the island-shaped photoresist layer 150 having the first thickness covers an edge of the channel region 142 and the low doped regions 144.

In details, the island-shaped photoresist layer 150 is exposed and developed by a halftone mask 160 to form the island-shaped photoresist layer 150. The halftone mask 160 has an opaque region 162 and a light transmissive region 164. The light transmissive region 164 of the halftone mask 160 corresponds to the edge of the channel region 142 and the low doped regions 144, and the opaque region 162 of the halftone mask 160 corresponds to the another position of the polysilicon layer 140.

Figure 8:
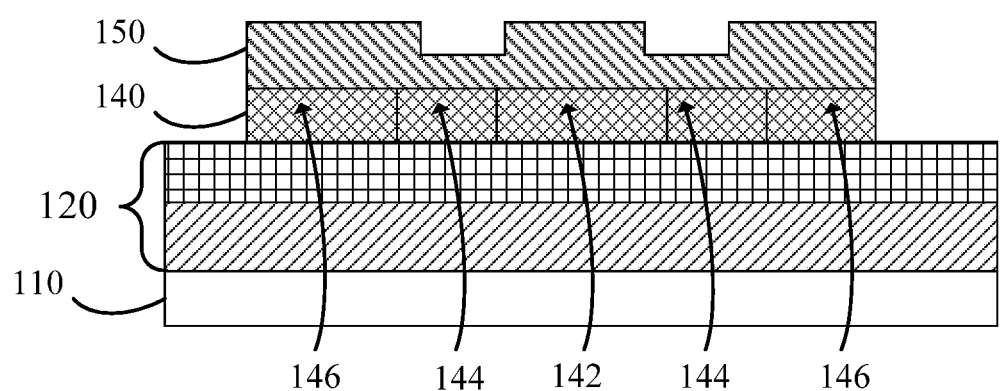
FIG. 8 is a schematic diagram of a method for manufacturing a low temperature polysilicon layer according to an embodiment of the present disclosure.

Referring to FIGS. 1 and 8, in a step 7, the polysilicon layer 140 not covered by the island-shaped photoresist layer 150 is removed by etching.

Figure 9:
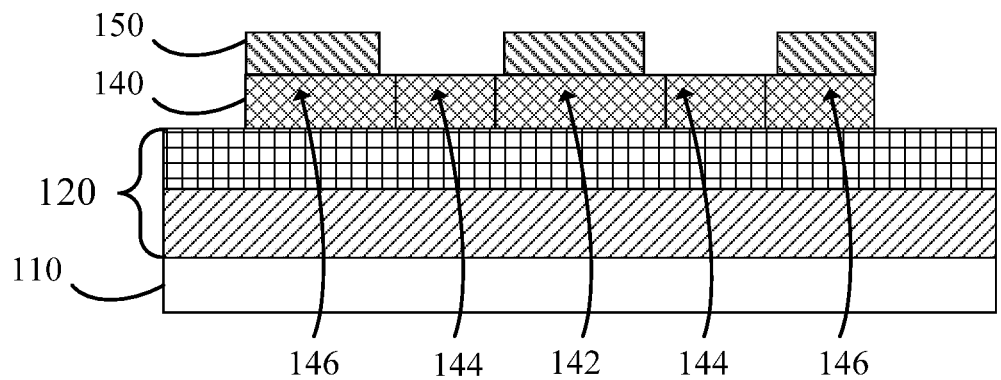
FIG. 9 is a schematic diagram of a method for manufacturing a low temperature polysilicon layer according to an embodiment of the present disclosure.

Referring to FIGS. 1 and 9, in a step 8, the island-shaped photoresist layer 150 covering the edge of the channel region 142 and the low doped regions 144 is removed to expose the edge of the channel region 142 and the low doped regions 146.

In details, the island-shaped photoresist layer 150 covering an edge of the high doped regions 146 is also removed to expose the edge of the high doped regions 146, and the edge of the high doped regions 146 contacts the low doped regions 144.

In details, the island-shaped photoresist 150 covering the edge of the channel region 142, the low doped regions 144, and the edge of the high doped regions 146 is subjected to a photoresist ash process by introducing oxygen (02) to remove the island-shaped photoresist layer 150 covering the edge of the channel region 142, the low doped regions 144, and the edge of the high doped regions 146.

Figure 10:
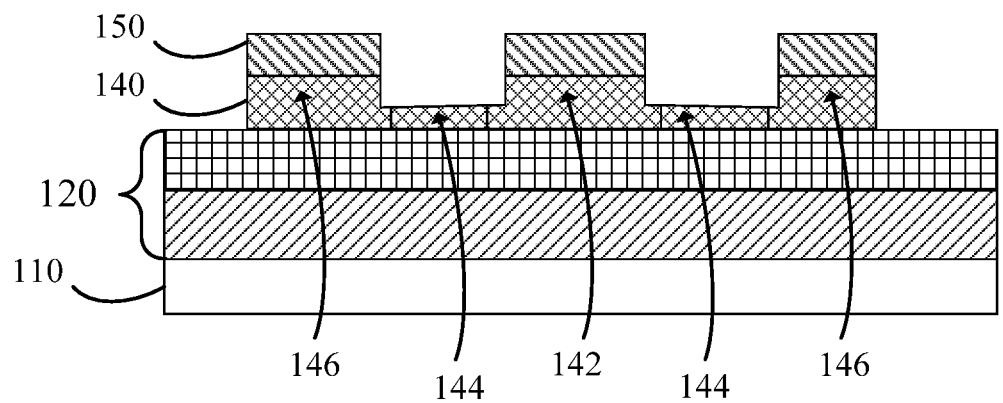
FIG. 10 is a schematic diagram of a method for manufacturing a low temperature polysilicon layer according to an embodiment of the present disclosure.

Referring to FIGS. 1 and 10, in a step 9, etching the edge of the channel region 142 and at least one portion of the low doped regions 144 such that thicknesses of the edge of the channel region 142 and the low doped regions 144 are less than a thickness of another position of the polysilicon layer 140 to form the island-shaped polysilicon layer. The thicknesses of the edge of the channel region 142 and the low doped regions 144 are controlled, for example, by controlling etching time to form the island-shaped polysilicon layer.

In details, the polysilicon layer 140 is, for example, an island-shaped polysilicon layer having a convex shape.

In details, the channel region 142 of the polysilicon layer 140 has a different thickness, and thicknesses of the edge of the channel region 142 and at least one portion of the low doped regions 144 of the polysilicon layer 140 are less than a thickness of another position of the channel region 142 of the polysilicon layer 140.

In details, not all of the low doped regions 144 are etched, for example, at a boundary of the channel region 142, about 0.5 um to 1 um from the boundary of the channel region 142 needs to be etched, and the low doped regions 144 have a width ranges between 0.7 um and 1.5 um, the low doped regions 144 may not be completely etched, but all etching may even extend to partially high doped regions 146.

In details, the high doped regions 146 of the polysilicon layer 140 have different thicknesses, and an edge of the high doped regions 146 of the polysilicon layer 140 contacts the low doped regions 144, a thickness of the edge of the high doped regions 146 is equal to the thicknesses of the edge of the channel region 142 of the polysilicon layer 140 and the at least one portion of the low doped regions 144, and a thickness of another position of the high doped regions 146 is equal to a thickness of another position of the channel region 142 of the polysilicon layer 140.

Therefore, in the embodiment of the present disclosure, the another position of the channel region 142 of the polysilicon layer 140 having a greater thickness can provide good carrier transport performance, and the edge of the channel region 142 and the at least one portion of the low doped regions 144 having less thicknesses can reduce an absorption of photons.

Figure 11:
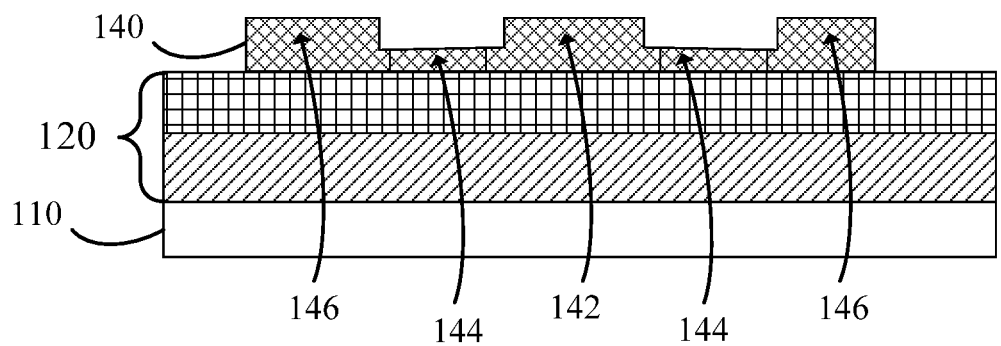
FIG. 11 is a schematic diagram of a method for manufacturing a low temperature polysilicon layer according to an embodiment of the present disclosure.

Referring to FIGS. 1 and 11, in a step 10, stripping the island-shaped photoresist layer 150 is provided.

So far, a fabrication of the low temperature polysilicon layer 10 has been completed.

The low temperature polysilicon layer 10 of the embodiment of the present disclosure does not need to be provided with a light shielding (LS) layer, at least saves a light shielding layer mask process, and therefore, a number of masks required for fabrication of the low temperature polysilicon layer 10 is reduced and a production cycle thereof is reduced. The low doped regions 144 and the channel region 142 of the polysilicon layer 140 are capable of generating photogenerated electron-hole pairs under illumination of a backlight 170 (illustrated in FIG. 13). However, only carriers positioned near the edge of the channel region 142 and the low doped regions 144 can be effectively separated by an applied electric field or PN junction. Photogenerated electron-holes positioned in a middle of the channel region 142 may quickly recombine and may not have a significant contribution to light leakage. Therefore, a primary approach to reducing photo-generated leakage current in embodiments of the present disclosure is to reduce a generation of photogenerated electron-hole pairs in the channel region 142 and low doped regions 144 and to reduce a separation efficiency of the photogenerated electron-hole pairs.

It should be noted that the p-type semiconductor and the n-type semiconductor are formed on a same semiconductor substrate, and a space charge region formed at an interface between the p-type semiconductor and the n-type semiconductor is referred to as a PN junction.

The low temperature polysilicon layer 10 of the embodiment of the present disclosure saves the light shielding layer, at least saves a light shielding layer mask process, and therefore, a number of masks required for fabrication of the low temperature polysilicon layer 10 is reduced and a production cycle thereof is reduced. The channel region 142 can provide good carrier transport performance, reduce a generation of photogenerated electron-hole pairs in the channel region 142 and the low doped regions 144, and reduce a separation efficiency of the photogenerated electron-hole pairs, thereby reducing photo-generated leakage current.

Figure 12:
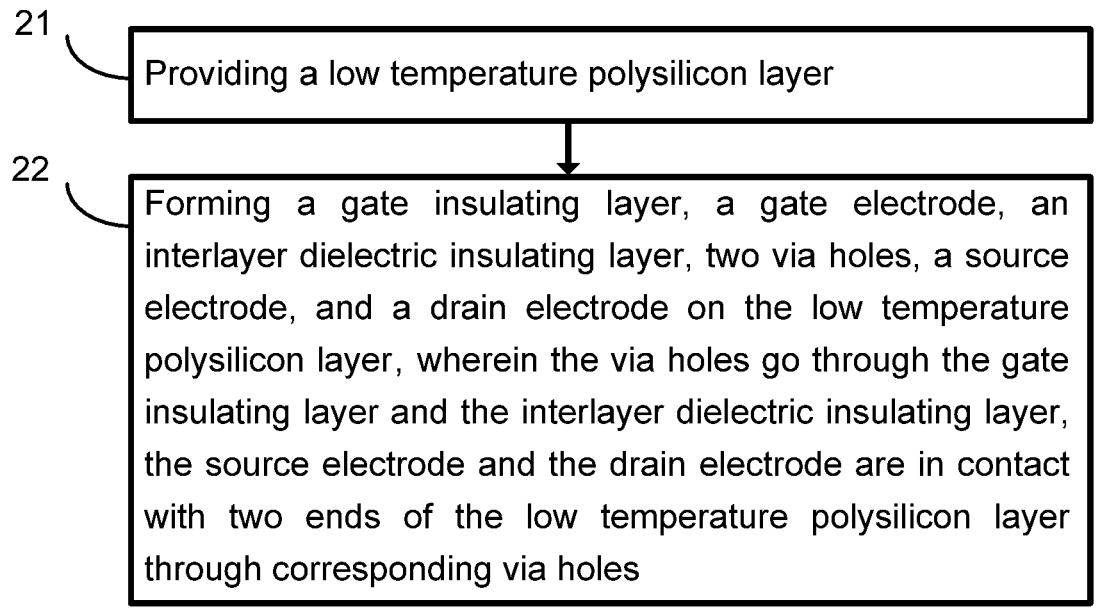
FIG. 12 is a flowchart of a method for manufacturing a thin film transistor according to an embodiment of the present disclosure.

Referring to FIG. 12, an embodiment of the present disclosure provides a method for manufacturing a thin film transistor including following steps.

Figure 13:
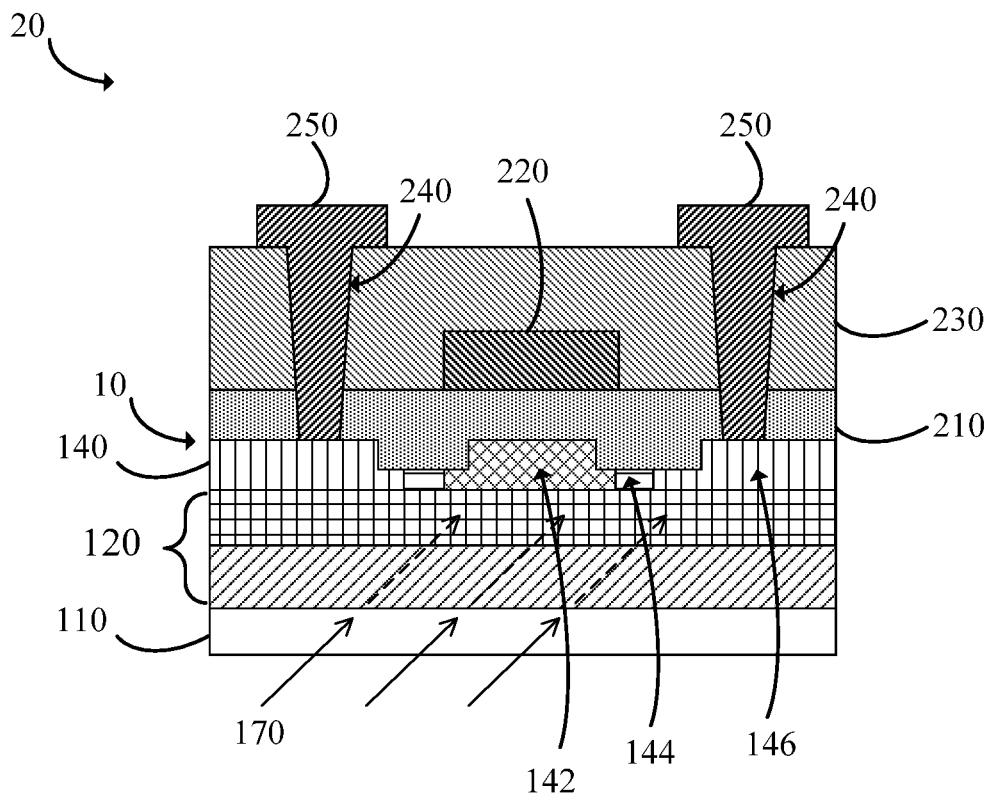
FIG. 13 is a schematic diagram of a method for manufacturing a thin film transistor according to an embodiment of the present disclosure.

Referring to FIGS. 12 and 13, in a step 21, a low temperature polysilicon layer 10 is provided.

In details, the low temperature polysilicon layer 10 is formed by the method for manufacturing the low temperature polysilicon layer 10 as described above, that is, the steps 1 to 12 as described above.

Referring to FIGS. 12 and 13, in a step 22, a gate insulating layer 210, a gate electrode 220, an interlayer dielectric insulating layer 230, two via holes 240, a source electrode 250, and a drain electrode 260 are formed on the low temperature polysilicon layer 10. The via holes 240 go through the gate insulating layer 210 and the interlayer dielectric insulating layer 230, the source electrode 250 and the drain electrode 260 are in contact with two ends of the low temperature polysilicon layer 10 through corresponding via holes 240.

In details, material of the gate insulating layer 210 includes silicon oxide (SiOx). Material of the gate electrode 220 includes molybdenum (Mo). Material of the interlayer dielectric insulating layer 230 is silicon nitride (SiNx), silicon oxide (SiOx), or a combination of SiNx and SiOx. Material of the source electrode 250 and the drain electrode 260 includes aluminum (Al).

In details, the source electrode 250 and the drain electrode 260 are in contact with the high doped regions 146 of the polysilicon layer 140 through the corresponding via holes 240.

In details, a distance between the gate electrode 220 and the edge of the channel region 142 of the polysilicon layer 140 is less than a distance between the gate electrode 220 and another position of the channel region 142 of the polysilicon layer 140. Therefore, an electric field intensity of the edge of the channel region 142 can be reduced, a dark current can be reduced, and a separation of photogenerated electron-hole pairs can be suppressed.

In details, a distance between the gate electrode 220 and at least one portion of the low doped regions 144 of the polysilicon layer 140 is less than a distance between the gate electrode 220 and another position of the channel region 142 of the polysilicon layer 140. Therefore, an electric field intensity of the low doped regions 144 can be reduced, a dark current can be reduced, and a separation of photogenerated electron-hole pairs can be suppressed.

So far, a fabrication of the thin film transistor 20 has been completed.

The thin film transistor 20 is, for example, an n-type thin film transistor.

The thin film transistor 20 of the embodiment of the present disclosure saves the light shielding layer, at least saves a light shielding layer mask process, and therefore, a number of masks required for fabrication of the low temperature polysilicon layer 10 is reduced and a production cycle thereof is reduced. The channel region 142 can provide good carrier transport performance, reduce a generation of photogenerated electron-hole pairs in the channel region 142 and the low doped regions 144, and reduce a separation efficiency of the photogenerated electron-hole pairs. Therefore, an electric field intensity of the edge of the channel region 142 can be reduced, a dark current can be reduced, thereby reducing photo-generated leakage current and increasing an optical display performance of a product, for example, crosstalk, flicker, and contrast reduction are improved.

Figure 14:
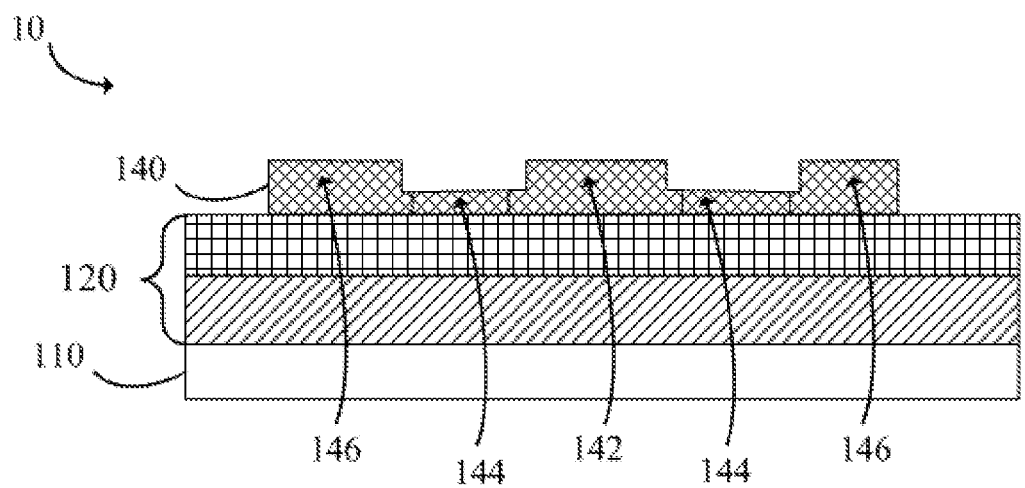
FIG. 14 is a schematic structural diagram of a low temperature polysilicon layer according to an embodiment of the present disclosure.

Referring to FIG. 14, a schematic structural diagram of the low temperature polysilicon layer 10 according to an embodiment of the present disclosure is provided.

The low temperature polysilicon layer 10 of the embodiment of the present disclosure includes a substrate 110, at least one buffer layer 120, and a polysilicon layer 140. The at least one buffer layer 120 is disposed on the substrate 110. The polysilicon layer 140 is disposed on the at least one buffer layer 120. The polysilicon layer 140 includes a channel region 142, two low doped regions 144 disposed on two sides of the channel region 142, and two high doped regions 146 disposed on an outer side of the low doped regions 144. Thicknesses of an edge of the channel region 142 and at least one portion of the low doped regions 144 are less than a thickness of another position of the polysilicon layer 140.

In details, the polysilicon layer 140 is, for example, an island-shaped polysilicon layer having a convex shape. The substrate 110 is, for example, a glass substrate.

In details, material of the at least one buffer layer 120 is silicon nitride (SiNx), silicon oxide (SiOx), or a combination of SiNx and SiOx. The at least one buffer layer 120 may be a structure of two buffer layers. Material of the two buffer layers can be different. Because the at least one buffer layer 120 is disposed on the substrate 110, an ion diffusion and heat preservation is blocked, and the substrate 110 is prevented from being damaged.

In details, the low doped regions 144 are n-type low doped regions, and the high doped regions 146 are n-type high doped regions.

In details, the channel region 142 of the polysilicon layer 140 has a different thickness, and thicknesses of the edge of the channel region 142 and at least one portion of the low doped regions 144 of the polysilicon layer 140 are less than a thickness of another position of the channel region 142 of the polysilicon layer 140. Therefore, the low doped regions 144 having a small thickness can suppress hot carriers.

In details, the high doped regions 146 of the polysilicon layer 140 have different thicknesses, and an edge of the high doped regions 146 of the polysilicon layer 140 contacts the low doped regions 144, a thickness of the edge of the high doped regions 146 is equal to the thicknesses of the edge of the channel region 142 of the polysilicon layer 140 and the at least one portion of the low doped regions 144, and a thickness of another position of the high doped regions 146 is equal to a thickness of another position of the channel region 142 of the polysilicon layer 140.

Therefore, in the embodiment of the present disclosure, the another position of the channel region 142 of the polysilicon layer 140 having a greater thickness can provide good carrier transport performance, and the edge of the channel region 142 and the at least one portion of the low doped regions 144 having less thicknesses can reduce an absorption of photons.

The low temperature polysilicon layer 10 of the embodiment of the present disclosure saves the light shielding layer, the channel region 142 can provide good carrier transport performance, reduce a generation of photogenerated electron-hole pairs in the channel region 142 and the low doped regions 144, and reduce a separation efficiency of the photogenerated electron-hole pairs, thereby reducing photo-generated leakage current.

Figure 15:
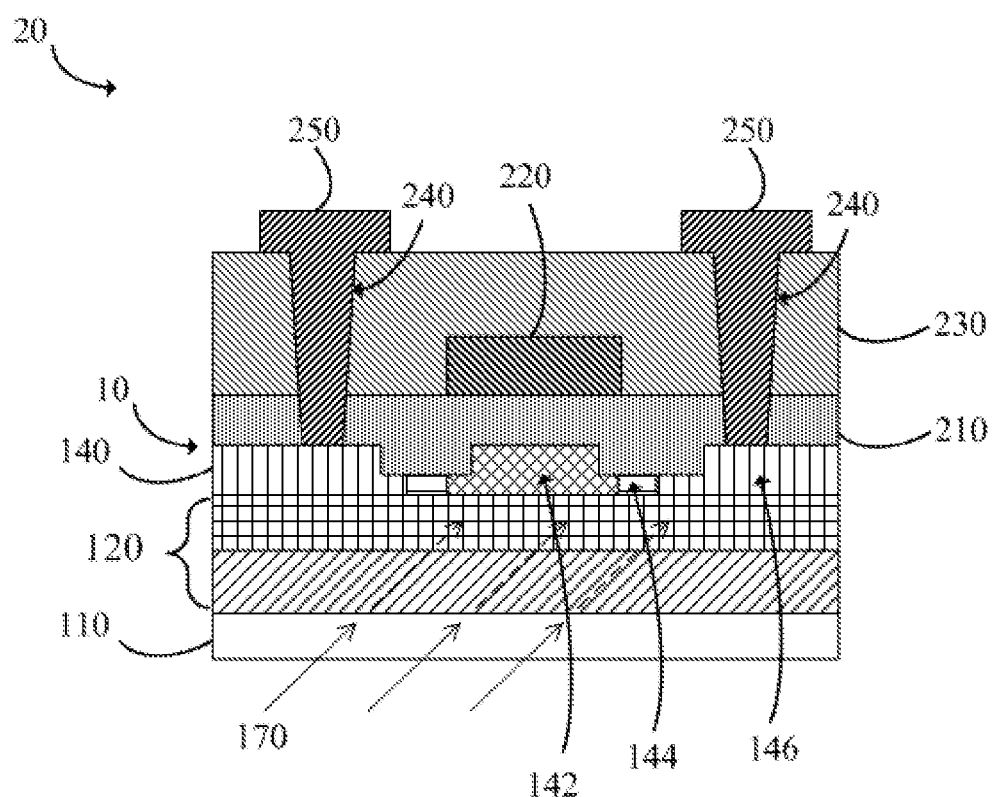
FIG. 15 is a schematic structural diagram of a thin film transistor according to an embodiment of the present disclosure.

Referring to FIG. 15, a schematic structural diagram of a thin film transistor 20 according to an embodiment of the present disclosure is provided.

The thin film transistor 20 of the embodiment of the present disclosure includes the foregoing low temperature polysilicon layer 10 and a gate insulating layer 210, a gate electrode 220, an interlayer dielectric insulating layer 230, two via holes 240, a source electrode 250, and a drain electrode 260 disposed on the low temperature polysilicon layer 10. The via holes 240 go through the gate insulating layer 210 and the interlayer dielectric insulating layer 230, and the source electrode 250 and the drain electrode 260 are in contact with two ends of the low temperature polysilicon layer 10 through corresponding via holes 240.

In details, material of the gate insulating layer 210 includes silicon oxide (SiOx). Material of the gate electrode 220 includes molybdenum (Mo). Material of the interlayer dielectric insulating layer 230 is silicon nitride (SiNx), silicon oxide (SiOx), or a combination of SiNx and SiOx. Material of the source electrode 250 and the drain electrode 260 includes aluminum (Al).

In details, the source electrode 250 and the drain electrode 260 are in contact with the high doped regions 146 of the polysilicon layer 140 through the corresponding via holes 240.

In details, a distance between the gate electrode 220 and the edge of the channel region 142 of the polysilicon layer 140 is less than a distance between the gate electrode 220 and another position of the channel region 142 of the polysilicon layer 140. Therefore, an electric field intensity of the edge of the channel region 142 can be reduced, a dark current can be reduced, and a separation of photogenerated electron-hole pairs can be suppressed.

In details, a distance between the gate electrode 220 and at least one portion of the low doped regions 144 of the polysilicon layer 140 is less than a distance between the gate electrode 220 and another position of the channel region 142 of the polysilicon layer 140. Therefore, an electric field intensity of the low doped regions 144 can be reduced, a dark current can be reduced, and a separation of photogenerated electron-hole pairs can be suppressed.

The thin film transistor 20 of the embodiment of the present disclosure saves the light shielding layer, the channel region 142 can provide good carrier transport performance, reduce a generation of photogenerated electron-hole pairs in the channel region 142 and the low doped regions 144, and reduce a separation efficiency of the photogenerated electron-hole pairs. Therefore, an electric field intensity of the edge of the channel region 142 can be reduced, a dark current can be reduced, thereby reducing photo-generated leakage current and increasing an optical display performance of a product, for example, crosstalk, flicker, and contrast reduction are improved.

In the embodiment of the present disclosure, thicknesses of an edge of the channel region and at least one portion of the low doped regions are less than a thickness of another position of the polysilicon layer. The polysilicon layer is an island-shaped polysilicon layer. The embodiment of the present disclosure can reduce an absorption of photons by the low temperature polysilicon layer and reduce photo-induced leakage current of the low temperature polysilicon layer.

Although the present disclosure is described via one or more embodiments, those of ordinary skill in the art can come up with equivalent variations and modifications based upon the understanding of the specification and the accompanying drawings. The present disclosure includes all such modifications and variations, and is only limited by the scope of the appended claims. In particular, as to the various functions performed by the components described above, the terms used to describe the components are intended to correspond to any component performing the specific functions (e.g., which are functionally equivalent) of the components (unless otherwise indicated), even those which are structurally different from the disclosed structure for performing the functions in the exemplary embodiments in the specification shown herein. In addition, although a particular feature in the specification is disclosed in only one of many embodiments, this feature may be combined with one or more features in other embodiments which are desirable and advantageous to a given or particular application. Moreover, the terms "include", "have", "consist of", or variations thereof used in the detailed description or the claims are intended to be used in a manner similar to the term "comprising".

In summary, although the preferable embodiments of the present disclosure have been disclosed above. It should be noted that those of ordinary skill in the art can make a variety of improvements and substitutions on the premise of not deviating from the technical principle of the present disclosure, and these improvements and substitutions should be encompassed within the protection scope of the present disclosure.

The invention claimed is:

1. A method for manufacturing a low temperature polysilicon layer, comprising:
providing a substrate;
forming at least one buffer layer on the substrate;
forming a polysilicon layer on the at least one buffer layer;
patterning the polysilicon layer to form a channel region, wherein two sides of the channel region comprise two low doped regions symmetrically disposed, and an outer side of the low doped regions comprise two high doped regions symmetrically disposed;
depositing an island-shaped photoresist layer on the channel region, the low doped regions, and the high doped regions of the polysilicon layer;
removing an edge of the channel region and the island-shaped photoresist layer in the low doped regions to expose an edge of the channel region and the low doped regions;
etching the edge of the channel region and at least one portion of the low doped regions such that thicknesses of the edge of the channel region and the at least one portion of the low doped regions are less than a thickness of another position of the polysilicon layer to form an island-shaped polysilicon layer; and
stripping the island-shaped photoresist layer;
wherein the low doped regions are n-type low doped regions, and the high doped regions are n-type high doped regions;
wherein the island-shaped photoresist layer has a first thickness and a second thickness, the first thickness is less than the second thickness, and the island-shaped photoresist layer having the first thickness covers the edge of the channel region and the low doped regions;
wherein the island-shaped photoresist layer is exposed and developed by a halftone mask to form the island-shaped photoresist layer, the halftone mask has an opaque region and a light transmissive region, the light transmissive region of the halftone mask corresponds to the edge of the channel region and the low doped regions, and the opaque region of the halftone mask corresponds to the another position of the polysilicon layer.

2. The method for manufacturing the low temperature polysilicon layer according to claim 1, wherein the channel region of the polysilicon layer has different thicknesses, the thicknesses of the edge of the channel region of the polysilicon layer and the at least one portion of the low doped regions are less than a thickness of another position of the channel region of the polysilicon layer.

3. The method for manufacturing the low temperature polysilicon layer according to claim 1, wherein the high doped regions of the polysilicon layer have different thicknesses, and an edge of the high doped regions of the polysilicon layer contacts the low doped regions, a thickness of the edge of the high doped regions is equal to the thicknesses of the edge of the channel region of the polysilicon layer and the at least one portion of the low doped regions, and a thickness of another position of the high doped regions is equal to a thickness of another position of the channel region of the polysilicon layer.

4. A method for manufacturing a low temperature polysilicon layer, comprising:
providing a substrate;
forming at least one buffer layer on the substrate;
forming a polysilicon layer on the at least one buffer layer;
patterning the polysilicon layer to form a channel region, wherein two sides of the channel region comprise two low doped regions symmetrically disposed, and an outer side of the low doped regions comprise two high doped regions symmetrically disposed;

depositing an island-shaped photoresist layer on the channel region, the low doped regions, and the high doped regions of the polysilicon layer;

removing an edge of the channel region and the island-shaped photoresist layer in the low doped regions to expose an edge of the channel region and the low doped regions;

etching the edge of the channel region and at least one portion of the low doped regions such that thicknesses of the edge of the channel region and the at least one portion of the low doped regions are less than a thickness of another position of the polysilicon layer to form an island-shaped polysilicon layer; and stripping the island-shaped photoresist layer.

5. The method for manufacturing the low temperature polysilicon layer according to claim 4, further comprising forming an amorphous silicon layer on the at least one buffer layer, performing an excimer laser operation to the amorphous silicon layer to cause the amorphous silicon layer to become the polysilicon layer, and removing the polysilicon layer not covered by the island-shaped photoresist layer by etching.

6. The method for manufacturing the low temperature polysilicon layer according to claim 4, wherein the low doped regions are n-type low doped regions, and the high doped regions are n-type high doped regions.

7. The method for manufacturing the low temperature polysilicon layer according to claim 4, wherein the island-shaped photoresist layer has a first thickness and a second thickness, the first thickness is less than the second thickness, and the island-shaped photoresist layer having the first thickness covers the edge of the channel region and the low doped regions.

8. The method for manufacturing the low temperature polysilicon layer according to claim 7, wherein the island-shaped photoresist layer is exposed and developed by a halftone mask to form the island-shaped photoresist layer, the halftone mask has an opaque region and a light transmissive region, the light transmissive region of the halftone mask corresponds to the edge of the channel region and the low doped regions, and the opaque region of the halftone mask corresponds to the another position of the polysilicon layer.

9. The method for manufacturing the low temperature polysilicon layer according to claim 4, further comprising performing a photoresist ashing process to the island-shaped photoresist layer covering the edge of the channel region and the low doped regions by introducing oxygen to remove the island-shaped photoresist layer covering the edge of the channel region and the low doped regions.

10. The method for manufacturing the low temperature polysilicon layer according to claim 4, wherein the channel region of the polysilicon layer has different thicknesses, the thicknesses of the edge of the channel region of the polysilicon layer and the at least one portion of the low doped regions are less than a thickness of another position of the channel region of the polysilicon layer.

11. The method for manufacturing the low temperature polysilicon layer according to claim 4, wherein the high doped regions of the polysilicon layer have different thicknesses, and an edge of the high doped regions of the polysilicon layer contacts the low doped regions, a thickness of the edge of the high doped regions is equal to the thicknesses of the edge of the channel region of the polysilicon layer and the at least one portion of the low doped regions, and a thickness of another position of the high doped regions is equal to a thickness of another position of the channel region of the polysilicon layer.

12. A method for manufacturing a thin film transistor, comprising:

providing a low temperature polysilicon layer; and forming a gate insulating layer, a gate electrode, an interlayer dielectric insulating layer, two via holes, a source electrode, and a drain electrode on the low temperature polysilicon layer;

wherein the via holes go through the gate insulating layer and the interlayer dielectric insulating layer, the source electrode and the drain electrode are in contact with two ends of the low temperature polysilicon layer through corresponding via holes, and the low temperature polysilicon layer is formed by a method for manufacturing the low temperature polysilicon layer;

wherein the method for manufacturing the low temperature polysilicon layer comprises:

providing a substrate;

forming at least one buffer layer on the substrate;

forming a polysilicon layer on the at least one buffer layer;

patterning the polysilicon layer to form a channel region, wherein two sides of the channel region comprise two low doped regions symmetrically disposed, and an outer side of the low doped regions comprise two high doped regions symmetrically disposed;

depositing an island-shaped photoresist layer on the channel region, the low doped regions, and the high doped regions of the polysilicon layer;

removing an edge of the channel region and the island-shaped photoresist layer in the low doped regions to expose an edge of the channel region and the low doped regions;

etching the edge of the channel region and at least one portion of the low doped regions such that thicknesses of the edge of the channel region and the at least one portion of the low doped regions are less than a thickness of another position of the polysilicon layer to form an island-shaped polysilicon layer; and stripping the island-shaped photoresist layer.

13. The method for manufacturing the thin film transistor according to claim 12, wherein a distance between the gate electrode and the edge of the channel region of the polysilicon layer is less than a distance between the gate electrode and another position of the channel region of the polysilicon layer.

14. The method for manufacturing the thin film transistor according to claim 13, wherein a distance between the gate electrode and at least one portion of the low doped regions of the polysilicon layer is less than a distance between the gate electrode and another position of the channel region of the poly silicon layer.

* * * * *